United States Patent [19]

Hotze

[11] 3,723,943

[45] Mar. 27, 1973

[54] METHODS OF SECURING FLAT INTEGRATED CIRCUITS TO PRINTED WIRING BOARDS AND A SUPPORT DEVICE THEREFOR

[75] Inventor: Robert E. Hotze, Westerville, Ohio

[73] Assignee: Western Electric Company, Incorporated, New York, N.Y.

[22] Filed: Feb. 10, 1971

[21] Appl. No.: 114,197

[52] U.S. Cl......339/17 CF, 174/DIG. 3, 317/101 CP, 339/174

[51] Int. Cl...........................H01r 13/54, H05k 1/02

[58] Field of Search......339/17, 18, 36, 45 T, 59, 60, 339/61, 65, 66, 75 MP, 95, 119, 125, 126, 128, 132, 133, 150 C, 174, 176, 192, 191 M, 198.3; 317/101 CC, 101 CP, 101 R, 100 R; 174/DIG. 3

[56] References Cited

UNITED STATES PATENTS

| | | | |
|---|---|---|---|
| 3,366,914 | 1/1968 | McManus et al. | 339/17 C |
| 3,297,974 | 1/1967 | Pittman | 339/17 CF |
| 3,409,861 | 11/1968 | Barnes et al. | 339/174 |
| 3,391,383 | 7/1968 | Antes | 339/174 |
| 3,335,327 | 8/1967 | Damon et al. | 317/101 CP |
| 3,212,047 | 10/1965 | McDonough | 339/17 CF |
| 3,377,514 | 4/1968 | Ruehlemann et al. | 317/101 CP |
| 3,354,394 | 11/1967 | James | 339/17 CF X |

*Primary Examiner*—Marvin A. Champion
*Assistant Examiner*—Terrell P. Lewis
*Attorney*—W. M. Kain, R. P. Miller and A. C. Schwarz, Jr.

[57] ABSTRACT

A flat integrated circuit package, having leads extending in cantilever from the edge of a substrate, is held in engagement with a printed wiring board by a support device which is temporarily attached to the board. The board is passed adjacent to a wave-soldering device to facilitate the soldering of areas where the ends of the cantilevered leads are pressed by the support device into overlapping engagement with land areas of printed wiring on the board. The support device supports the package in such a manner that the integrated circuit is protected and shielded from molten solder and heat emanating therefrom during the period when the board is passed adjacent to the soldering device.

12 Claims, 4 Drawing Figures

INVENTOR
R.E. HOTZE

BY [signature]

ATTORNEY

METHODS OF SECURING FLAT INTEGRATED CIRCUITS TO PRINTED WIRING BOARDS AND A SUPPORT DEVICE THEREFOR

BACKGROUND OF THE INVENTION

1. Field of the Invention

This invention relates to methods of securing flat integrated circuits to printed wiring boards and a support device for facilitating the securing of the circuits to the boards, and relates particularly to methods of and a support device for supporting a flat integrated circuit package in engagement with a printed wiring board while leads of the integrated circuit are being secured to printed wiring on the board.

2. Description of the Prior Art

In the manufacture of numerous types of electrical equipment, various types of individual components having leads extending therefrom are presently being assembled and secured with printed wiring boards, some of which have printed wiring on one side only. Usually these components, such as resistors, capacitors, inductors, semiconductors and the like, are assembled with the board by inserting leads of the components through openings in the board so that the leads extend through to the circuit side of the board. Thereafter the ends of the leads are clinched to the board whereby they are pressed into engagement with land areas of printed wiring on the board.

Subsequent techniques, such as a wave-soldering operation, are employed to secure the leads with the land areas on the board. It is significant to note that the body portion of each of the components is positioned adjacent to the side of the printed wiring board which does not support any of the printed wiring and which is not exposed to the solder and heat emanating therefrom. This arrangement permits the body portion of the components to be protected and shielded while the clinched leads are being secured to the land areas by the solder applied during the wave-soldering operation.

Other techniques could be employed to secure the ends of the leads with the land areas of the printed wiring. For example, the leads of the components and the land areas of the printed wiring could be pretinned or solder coated and the assembly could then be passed through a solder-reflow device.

With the increased use of integrated circuit devices in many electronic systems, it became necessary to develop techniques for mass securing of the devices with supporting interconnecting circuits, such as printed wiring boards. One technique includes the packaging of the integrated circuit device within a molded housing with leads of substantial size extending from edge portions of the housing. Internally of the housing, the substantial leads are secured to fragile leads of the device. The substantial leads are formed and may be assembled and secured with printed wiring boards in the same way that the previously described components are assembled with boards. This technique involves utilization of additional materials, manufacturing processes and equipment and cautious handling of the device when it is being secured within the housing and when the fragile leads are being attached to the substantial leads of the package. This is a costly, time-consuming procedure for mounting the delicate integrated circuit device in order to protect the device and provide mounting attachment with external circuits.

Another technique considered in assembling and securing integrated circuit devices with printed circuit boards was to bend the fragile leads which extend in cantilever from the substrate supporting the integrated circuit. The bent leads would then be inserted into openings in the printed wiring board and clinched and secured with the board in the same manner as the components are assembled with the board. However, due to the delicate nature of the integrated circuit and the cantilevered leads, lead-forming operations would require costly precautions of an extreme nature in the handling and supporting of the integrated circuit. In addition, the cantilevered leads would not be sufficiently strong to sustain the forces exerted thereon during forming operations and subsequent insertion and clinching operations.

In some instances, the cantilevered leads would have to extend a considerable distance from the end of the substrate to provide sufficient lead length for assembly with the printed wiring. This requirement would tend to expose the fragile leads to many possible hazards which would result in damage to the leads, thereby requiring disposal of the integrated circuit device.

Therefore, it is obvious that a need exists for assembling and securing integrated circuit devices with printed wiring boards in an efficient and economical manner.

SUMMARY OF THE INVENTION

It is, therefore, an object of this invention to provide new and improved methods of and a support device for securing flat integrated circuits to printed wiring boards.

Another object of this invention is the provision of new and improved methods of and a support device for supporting a substrate in engagement with a printed wiring board with leads extending in cantilever from the substrate being urged into engagement with printed wiring on the board.

Still another object of this invention is the provision of new and improved methods of and a support device for protecting an integrated circuit from heat and external forces while leads of the integrated circuit are being secured with land areas of printed wiring on a board.

A method illustrating certain principles of the invention may comprise the steps of positioning a circuit-supporting carrier into a support device, and attaching the support device to a support board with leads of the circuit-supporting carrier extending from the carrier and the support device and being placed into engagement with printed wiring on the board as the support device is attached to the support board.

A support device illustrating certain principles of the invention may comprise means for receiving a substrate having an integrated circuit supported thereon, means for attaching the receiving means to a printed wiring board so that leads of the integrated circuit, which extend from the substrate, are placed in engagement with land areas of printed wiring on the board, and means for urging the leads into firm engagement with the land areas so that the leads may be subsequently secured to the land areas of the printed wiring.

BRIEF DESCRIPTION OF THE DRAWINGS

Other objects and features of the present invention will be more readily understood from the following detailed description thereof when read in conjunction with the accompanying drawings, in which.

DETAILED DESCRIPTION

Figure 1:
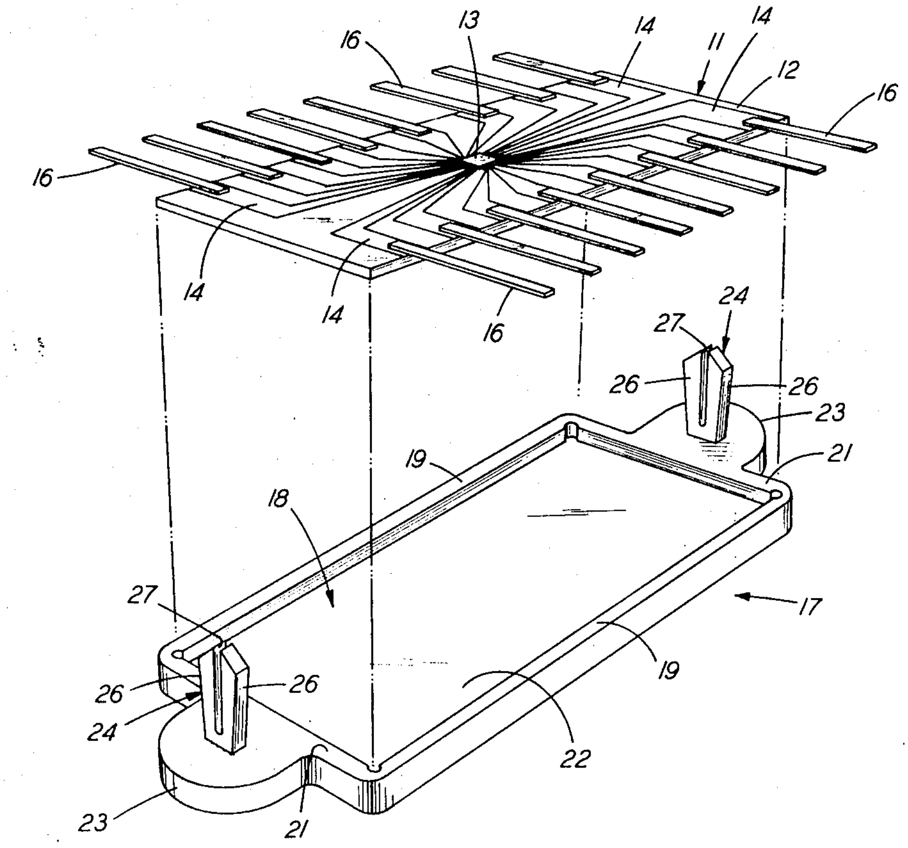
FIG. 1 is a perspective view of a support device in accordance with certain principles of the invention aligned with a flat integrated circuit package supporting an integrated circuit thereon and having circuit leads extending in cantilever from opposite edges thereof.

Referring to FIG. 1, there is illustrated a circuit-supporting carrier, such as a flat integrated circuit package, designated generally by the numeral 11, which includes a flat ceramic substrate 12 having an integrated circuit 13 supported on one major surface thereof. Deposited leads 14—14 extend from the integrated circuit 13 to locations along opposite longitudinal edges of the substrate 12. A plurality of terminating leads 16—16 are assembled with and attached to the deposited leads 14—14 and extend in cantilever from the longitudinal edges of the substrate 12 to facilitate the connection of the integrated circuit 13 with external circuits. The underside of the flat substrate 12, which is the other major surface thereof, can be provided with a printed code designation (not shown) to indicate the electrical structure and other aspects of the integrated circuit 13.

Referring further to FIG. 1, there is illustrated a support device, designated generally by the numeral 17, which is composed of a plastic material capable of being exposed to high temperatures without damage thereto or breakdown thereof. The support device 17 will be subjected to a temperature of about 525° F. in a wave-soldering operation and should be composed of a plastic material suitable for withstanding such a high temperature. An example of a suitable plastic material for the support device 17 is one which is commercially available under the trademark Teflon.

A substantially flat segment of the support device 17 is formed with a rectangularly shaped cavity, designated generally by the numeral 18, in one major surface thereof. The cavity 18 conforms generally to the cubic dimensions of the flat substrate 12 and is surrounded by opposed side walls 19-19 and opposed end walls 21—21 and includes a bed 22. Flanges 23—23 are formed integrally with the end walls 21-21.

Each of the flanges 23—23 is provided with attaching means, such as a locking tab, designated generally by the numeral 24. Each of the locking tabs 24—24 is formed integrally with the adjacent flange 23, and is provided with a pair of substantially parallel fingers 26—26 separated by a space 27. The outer ends of the fingers 26—26 can be biasingly urged together to substantially close the portion of the space 26 adjacent thereto.

Figure 2:
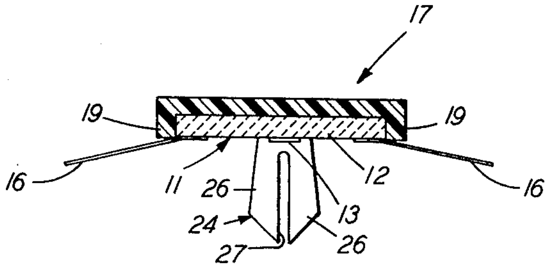
FIG. 2 is a sectional view showing the flat package assembled within the support device with the leads being deflected and bent by portions of the device.

In utilization of the support device 17, the flat substrate 12 is positioned within the cavity 18 which forms a nesting means for receiving the substrate with the underside of the substrate being placed on the bed 22. The depth dimension of the cavity 18 is slightly greater than the thickness of the substrate 12. When the underside of the flat substrate 12 is placed on the bed 22 of the cavity 18, the side of the substrate which supports the integrated circuit 13 is exposed but slightly below the plane of the outer shoulder surfaces of the walls 19—19 and 21—21. This causes the cantilevered portions of the terminating leads 16—16 to be bent outwardly by the outer shoulder surfaces of the walls 19—19, as illustrated in FIG. 2.

Figure 3:
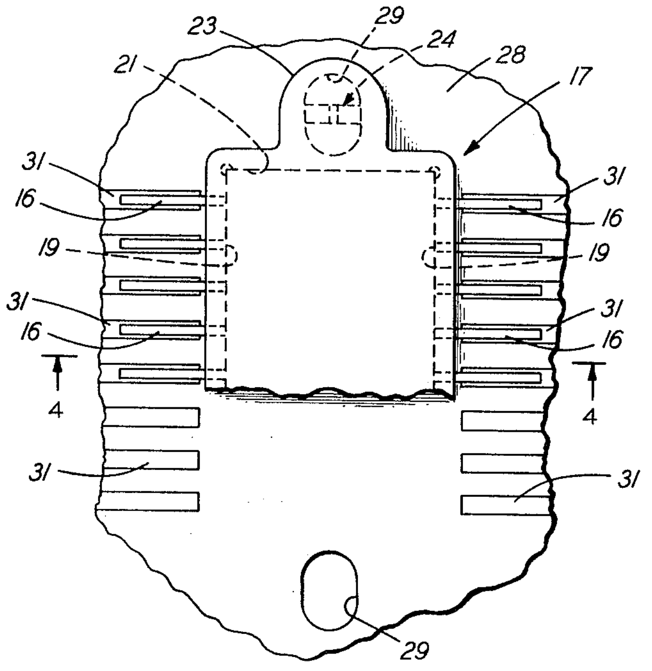
FIG. 3 is a partial plan view showing portions of a printed wiring board having printed wiring land areas thereon with a portion of the support device of FIG. 1 assembled therewith.

As illustrated in FIG. 3, the support device 17 is then moved forward and positioned adjacent to a printed wiring side of a printed wiring board 28 with the locking tabs 24—24 being aligned with oblong openings 29—29 formed in spaced portions of the board. The support device 17 is manipulated so that the bent, cantilevered portions of the terminating leads 16—16 may be aligned with land areas 31—31 of printed circuits on the board 28. The support carrier 17 is moved toward the board 28 so that the locking tabs 24—24 enter and project partially through the oblong openings 29—29 and the cantilevered ends of the terminating leads 16—16 are located substantially over the land areas 31—31.

It is noted that the portion of the board 28 which is adjacent to the substrate 12 is solid and is not formed with any openings. Thus the oblong openings 29—29 are the only openings in the board in the general area of the support device 17.

Figure 4:
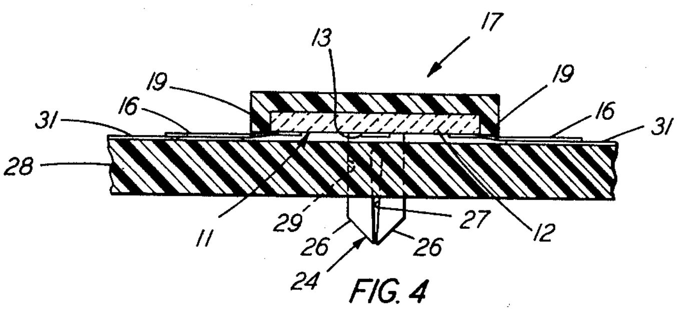
FIG. 4 is a sectional view, taken along line 4—4 of FIG. 3, showing the support device of FIG. 1 assembled with the printed wiring board of FIG. 3 with leads of the flat integrated circuit package being assembled with printed wiring on the board for a securing operation.

Since the locking tabs 24—24 are located in the oblong openings 29—29, the support device 17 can be shifted longitudinally to insure proper overlapping alignment of the terminating leads 16—16 with the land areas 31—31. The support device 17 is then pressed toward the printed wiring side of the board 28 so that the terminating leads 16—16 are biasingly urged into firm engagement with the land areas 31—31, as illustrated in FIG. 4. The locking tabs 24—24 then extend further through the oblong openings 29—29 to hold the support device 17 in the position as illustrated in FIG. 4. Additionally, the integrated circuit 13 is thereby placed within a protective enclosure which is formed by the assembly of the support device 17 with the board 28, as illustrated in FIG. 4.

Fastening means, other than the locking tabs 24—24, could be used to hold the support device 17 with the board 28 without departing from the spirit and scope of the invention. For example, the flanges 23—23 could be formed with through holes and separate fasteners, such as threaded members, could be used to fasten the support device 17 to the board 28.

The printed wiring board 28 can now be passed over a solder-applying facility such as a wave-soldering device (not shown) to apply solder to the areas where the terminating leads 16—16 overlap the land areas 31—31 so that the leads are secured with the land areas. The outer shoulder surfaces of the side walls 19—19 of the clamped support device 17 function as a means for urging the leads 16—16 into firm engagement with the land areas 31—31 to facilitate the securing of the leads with the land areas. Further, the configuration of the cavity 18, which includes the arrangement of the side walls 19—19, the end walls 21—21 and the depth of the cavity, facilitates the formation of the protective enclosure for the integrated circuit 13 when the support device 17 is assembled with the board 28. The protective enclosure shields and protects the integrated circuit 13 from molten solder and damaging levels of heat during the solder-applying operation. It is noted that discrete components, such as resistors, capacitors and the like, can be assembled and clinched to the board 28 in a conventional manner and soldered in the same operation in which the leads 16—16 of the flat integrated circuit package 11 are secured to the printed wiring.

After the board 28 has been passed adjacent to the solder-applying facility and the leads 16—16 are secured with the land areas 31—31, and subsequent to cleaning operations, the support device 17 is removed from the assembly with the board, whereby the flat integrated circuit package 11 remains assembled and secured with the board. The integrated circuit 13 remains in a protective location between the adjacent flat surface of the board 28 and the flat substrate 12, and is thereby protected from external elements and forces during normal handling and environmental use of the printed wiring board 28. The exposed major surface of the substrate 12 displays the code marking to indicate the electrical configuration of the integrated circuit 13 on the reverse unexposed side thereof. The support device 17 can be reused in the same manner described hereinabove.

The flat substrate 12 is conventionally thin and protrudes only slightly from the circuit side of the printed wiring board 28, which permits the board to be assembled in conventional mountings without any need for modification thereof.

The support device 17 can be modified to assume numerous configurations without departing from the spirit and scope of the invention. For example, transverse slots (not shown) could be formed in the side walls 19—19 of the support device 17 to receive the leads 16—16. The slots would provide lateral support for intermediate portions of the leads 16—16 particularly when the support device 17 is moved longitudinally during an alignment procedure. The cavity 18 could be modified to accommodate a substrate of a different configuration. However, the preferred embodiment is illustrated in FIGS. 1 through 4.

What is claimed is:

1. A method of securing leads of a circuit with printed wiring of a support board, which comprises the steps of:

- positioning a circuit-supporting carrier into a support device with leads of the carrier extending therefrom and from the support device;
- moving the support device toward a side of a support board having printed wiring thereon to place the extended leads of the carrier into exposed engagement with the printed wiring on the support board;
- attaching the support device to the side of the support board having the printed wiring to hold the extended leads in exposed engagement with the printed wiring of the support board during a subsequent operation wherein the leads are secured to the printed wiring, and
- shielding a circuit on the circuit-supporting carrier between the support device and the support board during the operation of securing the extended exposed leads to the printed wiring.

2. The method as set forth in claim 1, which further comprises the step of applying forces to the extended leads of the circuit-supporting carrier to press the extended exposed leads firmly into engagement with the printed wiring of the support board.

3. The method as set forth in claim 1, which further comprises the step of applying solder to areas which include the extended leads in exposed engagement with the printed wiring to join by soldering the leads and the printed wiring.

4. The method as set forth in claim 3, which further comprises the step of removing the support device from attachment to the support board, whereby the circuit-supporting carrier remains assembled and secured to the printed wiring side of the board by the extended leads being soldered to the printed wiring.

5. A device for supporting a circuit-supporting carrier for assembly and securing of leads extending from the carrier with printed wiring of a support board, which comprises:

- means for receiving therein a circuit-supporting carrier with leads thereof exposed and extending from the means and the carrier;
- means extending from the receiving means for attaching the receiving means to one side of a support board having printed wiring on the one side thereof;
- said attaching means formed integrally with the receiving means and movable therewith after said receiving means has been attached to the board to permit aligning of the extended exposed leads with the printed wiring, and
- means for pressing the extended exposed leads into firm engagement with the printed wiring on the one side of the support board as the receiving means is being attached to the support board.

6. The device as set forth in claim 5, wherein the pressing means includes shoulder surfaces of the receiving means which bend the leads outwardly from the receiving means and the carrier to firmly press the extended leads into exposed engagement with the printed wiring when the receiving means is attached to the board.

7. A device for supporting a flat integrated circuit package for assembly of leads of the package with printed wiring of a printed wiring board, which comprises:

- a substantially flat segment;
- the segment formed with a cavity in one surface thereof for receiving a flat integrated circuit package therein;
- the flat segment and cavity being of sufficient dimensions to permit leads of the flat integrated circuit package to extend in cantilever from edge portions of the flat segment;

the cavity of the flat segment having walls which are positionable adjacent to the printed wiring board to substantially enclose and shield an integrated circuit on the flat package so that the integrated circuit is protected from heat emanating from a subsequent securing operation where the extended exposed leads are secured with the printed wiring, and attaching means extending from the substantially flat segment for attaching the flat segment to a support board with the extended leads of the flat package placed in exposed engagement with printed wiring on the support board.

8. The device as set forth in claim 7, wherein the depth of the cavity is sufficiently greater than the flat integrated circuit package to permit the extended leads to be bent slightly outwardly from the flat package and the segment so that, when the flat segment is attached to the board, the leads initially engage and are subsequently urged into firm exposed engagement with the printed wiring.

9. The device as set forth in claim 7, wherein the attaching means comprises:

at least a pair of spaced tabs extending from and formed integrally with the surface of the flat segment which is formed with the cavity, and each of the tabs being formed with a pair of spaced fingers which are biasingly movable toward each other.

10. The device as set forth in claim 7, wherein the flat segment and attaching means are composed of a plastic material capable of withstanding temperatures up to and including at least 525° F. without structural breakdown and deformation.

11. The device as set forth in claim 7, wherein the attaching means extends from the surface of the flat segment which includes the cavity to attach the segment to the board with an integrated circuit on the package facing outwardly from the cavity and being positionable adjacent to the board for shielded protection by the flat segment from external forces and heat during subsequent securing of the leads to the printed wiring.

12. The device as set forth in claim 9, wherein the tabs are dimensioned to be moved into openings in the printed wiring board to attach the flat segment to the board and are movable within the openings to permit movement of the extended exposed leads relative to the printed wiring for aligning the leads.

* * * * *